(12) United States Patent
Wells

(10) Patent No.: US 6,828,874 B2
(45) Date of Patent: Dec. 7, 2004

(54) SIGNAL COMBINER

(75) Inventor: John Norman Wells, St. Albans (GB)

(73) Assignee: IFR Limited, Stevenage (GB)

( * ) Notice: Subject to any disclaimer, the term of this patent is extended or adjusted under 35 U.S.C. 154(b) by 315 days.

(21) Appl. No.: 10/204,780

(22) PCT Filed: Feb. 9, 2001

(86) PCT No.: PCT/GB01/00547
§ 371 (c)(1),
(2), (4) Date: Aug. 21, 2002

(87) PCT Pub. No.: WO01/63688
PCT Pub. Date: Aug. 30, 2001

(65) Prior Publication Data
US 2004/0174229 A1 Sep. 9, 2004

(30) Foreign Application Priority Data
Feb. 21, 2000 (GB) .............................. 0004059

(51) Int. Cl.[7] .............................................. H01P 5/12
(52) U.S. Cl. ...................... 333/100; 333/136; 333/25
(58) Field of Search .................... 333/100, 126, 333/134, 136, 25; 455/330, 326, 325

(56) References Cited

U.S. PATENT DOCUMENTS

| | | | | |
|---|---|---|---|---|
| 4,032,850 A | * | 6/1977 | Hill | 455/326 |
| 4,204,168 A | * | 5/1980 | Brown | 455/330 |
| 5,697,092 A | * | 12/1997 | Mourant et al. | 455/323 |
| 5,774,801 A | * | 6/1998 | Li et al. | 455/326 |
| 5,854,974 A | | 12/1998 | Li | |
| 6,078,802 A | * | 6/2000 | Kobayashi | 455/326 |
| 6,317,590 B1 | * | 11/2001 | Nash et al. | 455/331 |

FOREIGN PATENT DOCUMENTS

| | | | | |
|---|---|---|---|---|
| EP | 0 917 283 | | 5/1999 | |
| JP | 63209202 A | * | 8/1988 | H01P/5/10 |

* cited by examiner

Primary Examiner—Robert Pascal
Assistant Examiner—Kimberly Glenn
(74) Attorney, Agent, or Firm—Reising, Ethington, Barnes, Kisselle, P.C.

(57) ABSTRACT

A modulator 200 is based around a switching circuit 212 and a pausey stub balun 210. The balun 210 has a distributed resistance 232 to ground. The balun may be implemented as a strip line device (FIG. 5b).

8 Claims, 5 Drawing Sheets

SIGNAL COMBINER

This invention relates to methods and apparatus for combining signals. In particular, the invention relates to mixers, modulators and demodulators.

FIG. 1 shows a known mixer 100. A local oscillator signal is applied to port 110. Two further ports are provided: an RF port 118 and an IF port 112. The circuit can perform frequency upconversion or downconversion. In the case of upconversion the IF port 112 is used as a low frequency input and the RF port 118 is used as a high frequency output: if the input is a baseband signal the upconversion process is often referred to as "modulation" and the mixer is referred to as a "modulator". In the case of downconversion the RF port 118 is used as a high-frequency input and the IF port 112 is used as a low-frequency output: if the output is a baseband signal the process is often referred to as "demodulation" and the mixer is referred to as a "demodulator". The local oscillator signal is coupled, by transformer 114 to the circuit containing diodes 116. The local oscillator waveform controls the switching of diodes 116 and "chops" the input signal, thereby introducing a high frequency component if the input were a low frequency (upconversion), or introducing a low frequency component if the input were a high frequency (downconversion). To facilitate the input and output of the appropriate frequency signals the IF port 112 is connected to diodes 116 via a low-pass filter 122 (signified by an inductor) and the RF port is connected to diodes 116 via a high-pass filter 120 (signified by a capacitor). It can be shown mathematically that if the diodes act as perfect switches there is a perfectly linear relationship between both the amplitude and phase of the input and output signals. Imperfections in this switching typically result in non-linearity in both the amplitude and phase transfer characteristics of the mixer, either of which result in the introduction of additional unwanted spectral components at the output. These are generally referred to as intermodulation products.

There are certain problems and limitations with the mixer 100 of FIG. 1.

First, the balance of the signals supplied from the transformer 114 to the diode circuit is only good at low carrier frequencies and this degrades as the local oscillator frequency increases. This is because the port 110 is connected to an unbalanced source, and capacitive coupling between the windings of transformer 114, which causes signal breakthrough even in the absence of any stimulus being applied to the RF/IF port (112 and 118).

Second, intermodulation performance is only good at low carrier frequencies and also degrades as the local oscillator frequency increases. There is also a considerable variation of the intermodulation performance with frequency in a way that is complicated and difficult to predict and, at high frequencies, it is possible for the performance of the mixer to change from good to bad (or vice versa) over a relatively small change of frequency. It is believed that this performance change is due to an interaction of the switching action of the diodes 116 and the imperfect nature of the LO balancing transformer 114. The transformer 114 only works correctly at frequencies where the electrical lengths of the windings are short in comparison with the wavelength of the signals involved, in this case the local oscillator signal. However, the switching action of the diodes gives rise to a series of spectral components at harmonics of the local oscillator frequency and, at high local oscillator frequencies, the winding-lengths of the transformer will no longer be short in relation to the wavelengths of these spectral components.

Ideally, these harmonics are reflected back through the transformer 114 at the LO port and are ultimately absorbed by the source resistance of the local oscillator. In fact, it is usual to place some resistive attenuation between the LO source and the mixer to assist with this absorption when using local oscillators with poorly controlled source impedance. If this is not possible due to the limitations of the transformer, then the harmonics will be re-reflected back to the diodes in an amplitude and phase which may vary as a function of frequency, and in a way that may be detrimental to the switching action of the diodes 116.

In practice, the mixer 100 works effectively up to approximately 200 MHz. Above this there is a gradual deterioration of balance and intermodulation performance. Above about 1 GHz, balance becomes poor and intermodulation performance is heavily frequency dependent.

Third, the load presented to the local oscillator is highly asymmetric and, in effect, is a half-wave rectifier. A bias path must be provided for the rectification current otherwise the diodes cannot conduct and additionally it may be necessary to adjust this bias to obtain a good diode switching action where the signal mark-to-space ratio is near unity. Without this, excessive mixing will occur at the second and higher even order harmonics of the local oscillator signal.

It is an object of the invention to provide apparatus and methods of combining signals which ameliorate at least some of the aforementioned disadvantages.

According to one aspect, the invention provides signal combining apparatus comprising terminal means, switching means, and balun means, wherein the balun means is connected via the switching means to the terminal means and ground, the switching means being such that when a control signal is supplied to the balun means, the switching means alternately connects the balun means to the terminal means and to ground to generate an output signal related to an input signal in the terminal means.

According to another aspect, the invention also provides a method of combining signals using apparatus comprising balun means connected via switching means to terminal means and ground, the method comprising supplying an input signal to the terminal means, and supplying a control signal to the balun means to alternately connect the balun means via the switching means to the terminal means and to ground so that an output signal is generated in the terminal means.

The invention may be used for frequency up-conversion of the input signal, i.e. modulating the input signal onto a higher frequency signal. Alternatively, the invention may be used for frequency down-conversion of the input signal.

Selectively connecting the balun means to ground via the switching means provides that the balun means has a continuous path by which common mode currents may flow into and out of the balun means. This allows the balun means to have a common mode impedance that may be partly inductive without compromising the nature of the discontinuous current flow between the terminal means and the switching means.

The use of the balun means provides that the switching means is supplied with a balanced version of the control signal, The balun means provides that parasitic admittances to ground are more symmetrical, thereby improving the balance of the balanced signal.

The balun means may comprise a portion of transmission line connected to a portion of dummy line. Preferably, the balun means is a Pausey Stub balun. The Pausey Stub balun may comprise a length of coaxial waveguide with one end of the axial conductor being connected to a cylindrical conductor having substantially the same diameter as the outer conductor of the coaxial waveguide portion. The control signal is supplied to the other end of the axial conductor.

In another embodiment, a stripline implementation of the balun means is used. The transmission line portion of the balun means comprises a three conductor laminate with the control signal connected to the middle conductor. The dummy portion of the balun means comprises a section of the transmission line with the middle conductor omitted. The two layers of the dummy portion are connected to each other and to the middle conductor of the transmission line portion. Vias interconnect the outer conductors of each of the transmission line portion and the dummy portion.

Preferably, the outer surface of the transmission line and dummy portions of the balun means have a distributed resistance to ground thereon. The distributed resistance may decrease along either portion as one moves away from the connection between the portions. The distributed resistance may be provided by a resistive film of varying resistance or by distributed discrete resistors spaced along the outside of the portions. The discrete resistors may be spaced regularly or irregularly. The distributed resistance helps to control unwanted reflections of the control signal within the balun.

The switching means may be a diode arrangement. This diode arrangement may be such that it responds to the waveform of the control signal to alternately connect the balun means to the terminal means and to ground. The output signal may be generated by the chopping action imposed by alternately connecting the balun means to the terminal means and to ground by the diodes.

By way of example only, certain embodiments of the invention will now be described with reference to the accompanying drawings, in which.

Figure 1:
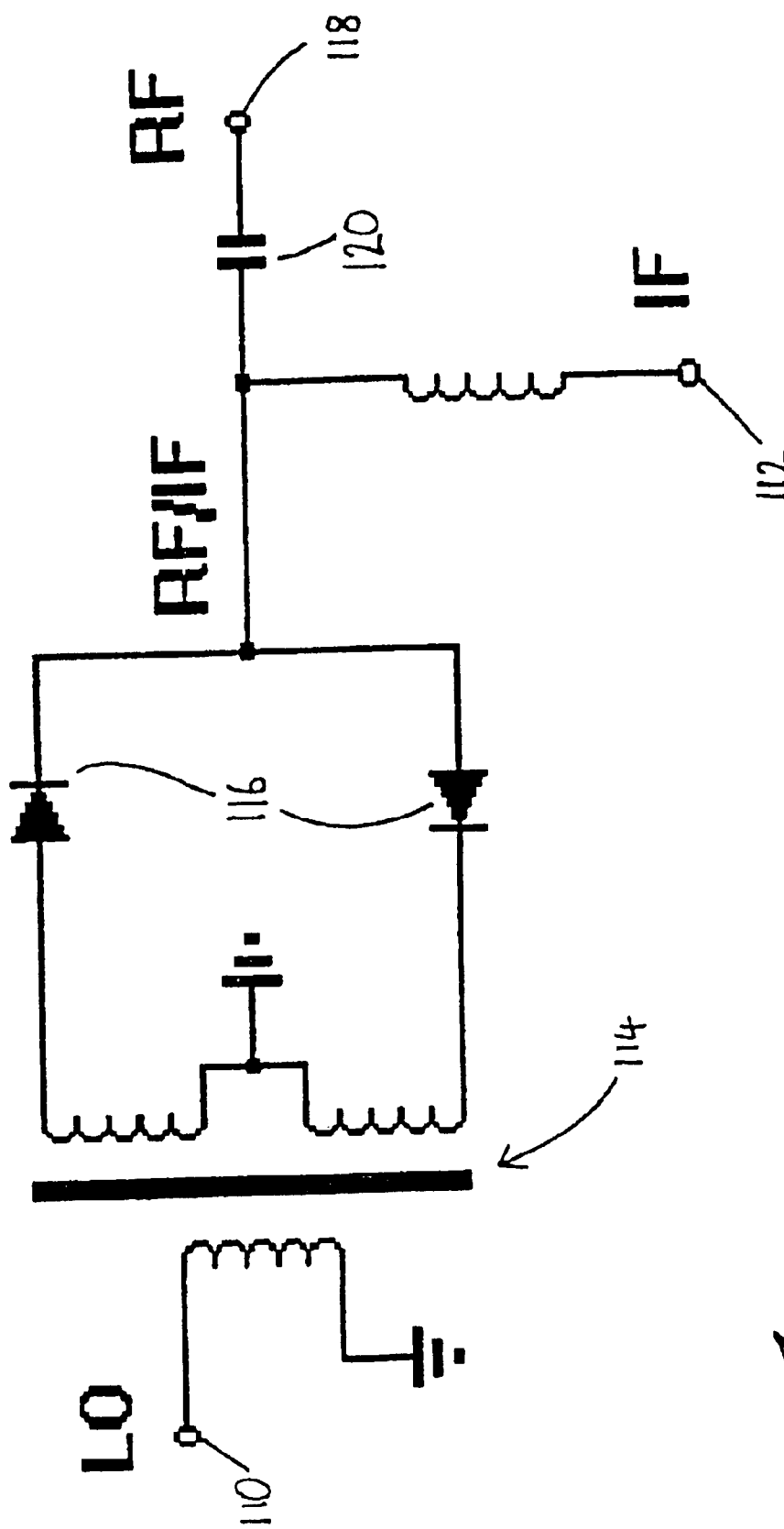
FIG. 1 illustrates a prior art mixer.
Figure 2:
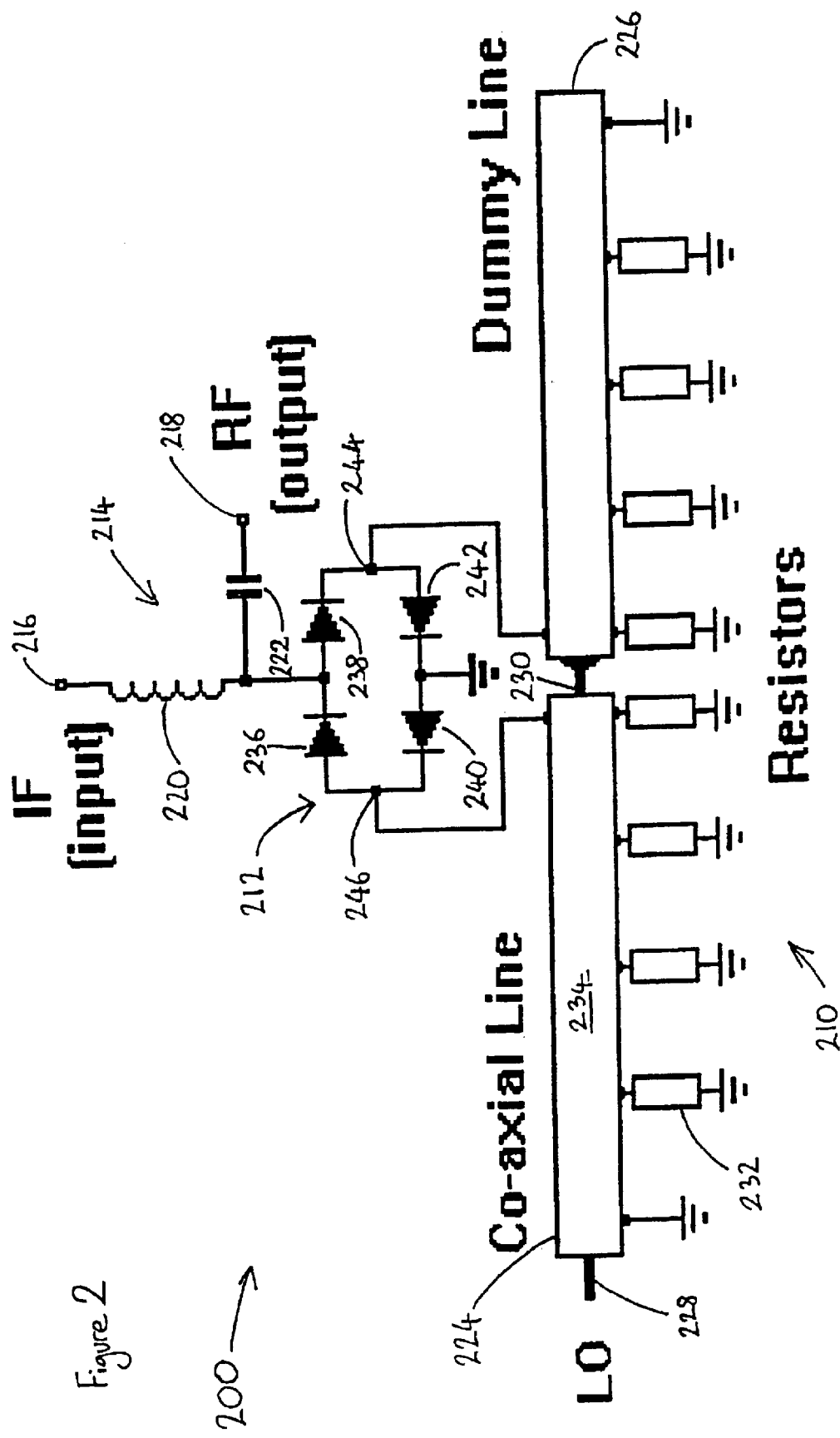
FIG. 2 illustrates a modulator having a balun.

The modulator 200 of FIG. 2 comprises a Pausey Stub balun 210 connected to an input port 214 via a diode switching circuit 212. The input port 214 comprises an IF port 216 and an RF port 218 connected to the switching circuit 212 by a low-pass filter 220 and a high-pass filter 222 respectively. An intermediate frequency (IF) input signal is supplied to port 216 and is mixed with a local oscillator signal (which is supplied to the balun) to yield a radio frequency (RF) signal which is extracted at port 218 via filter 222. Port 216 and 218 can be considered collectively to be the "input" to the modulator 200.

The balun 210 comprises a length of coaxial line 224 and a length of dummy line 226. The dummy line 226 comprises a cylinder of substantially the same length and diameter as coaxial line 224. The dummy line 226 can be formed by stripping the inner conductor from a length of coaxial cable and using solder to block the end intended to connect to the coaxial line 224. The local oscillator signal is supplied to the free end 228 of the axial conductor of coaxial line 224. The other end 230 of the axial conductor is connected to the dummy line 226. The purpose of the balun is to float the local oscillator signal with respect to ground. This means that the balun will supply two signals to the switching circuit 212 of equal amplitude and opposite sign, i.e. the signals supplied are balanced about electrical ground.

Physically spaced resistors (for example, 232) are connected between the outer conductor 234 of coaxial line 224 and ground, and between dummy line 226 and ground. The ends of coaxial line 224 and dummy line 226 distant from their point of interconnection are also earthed. The purpose of these resistors will be explained later.

The diode switching circuit 212 comprises a ring of four diodes 236, 238, 240 and 242. The switching circuit 212 is connected to earth at a point between diodes 240 and 242. The input 214 is connected to the switching circuit at a point between diodes 236 and 238. The end of dummy line 226 adjacent coaxial line 234 is connected to node 244 in switching circuit 212, between diodes 238 and 242. The outer conductor 234 of coaxial line 224 is connected, at its end adjacent dummy line 226, to node 246 in switching circuit 212, between diodes 236 and 240.

Figure 3:
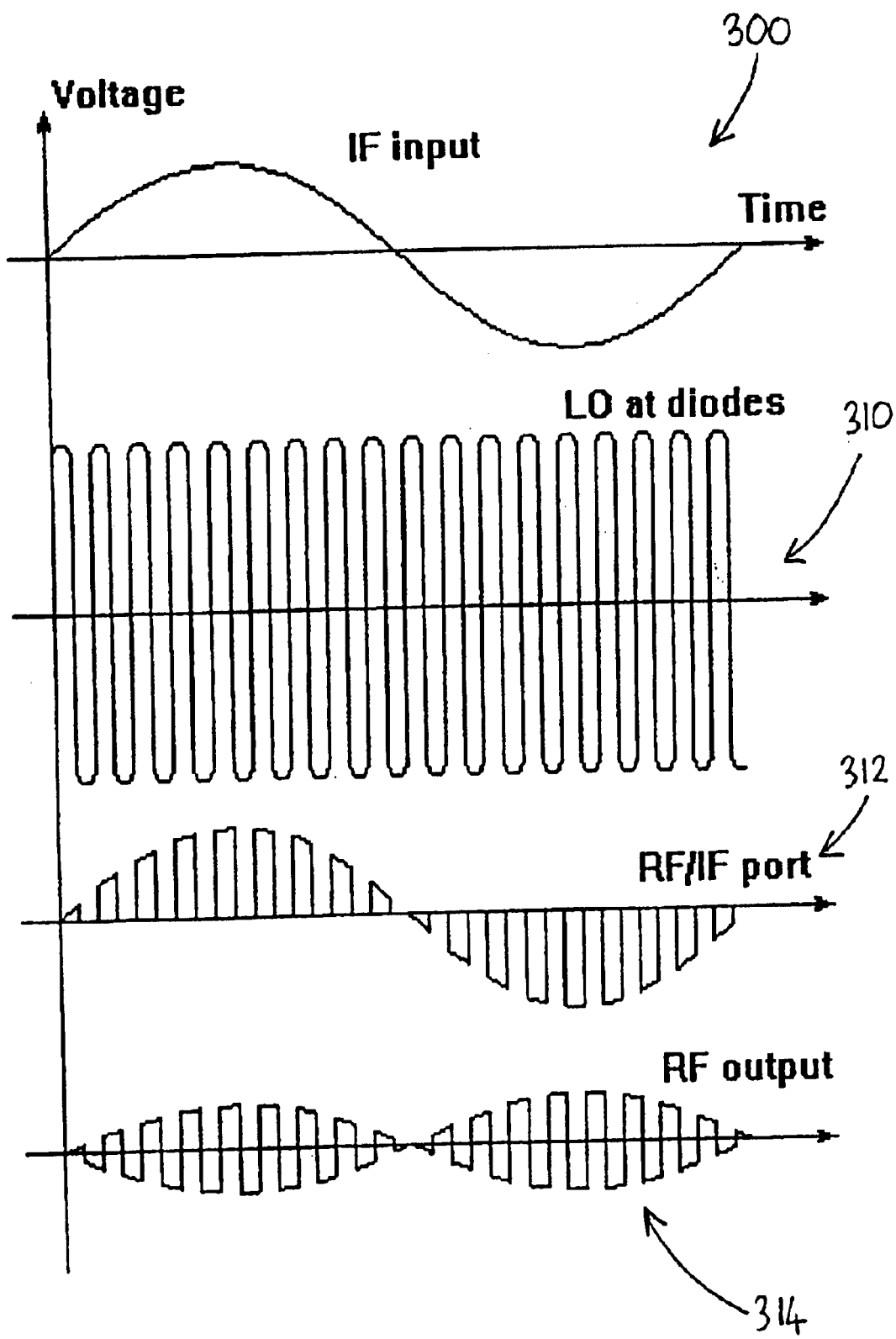
FIG. 3 illustrates some example waveforms for the modulator of FIG. 2.

The operation of modulator 200 will now be described with reference to FIG. 3. Trace 300 is an example of an IF waveform supplied to IF port 216. Trace 310 is an example of a local oscillator signal applied to the axial conductor 228 of the balun 210. The local oscillator signal 310 is transferred from the balun 210 to the diode switching circuit 212 at nodes 244 and 246. When the LO signal 310 makes node 246 positive, then node 244 goes negative and diodes 236 and 238 switch on, (provided that the amplitude of the LO signal is high enough) and diodes 240 and 242 are switched off. At such a time, switching circuit 212 connects the input 214 to the balun.

When the local oscillator signal 310 is such that node 244 is positive and node 246 is negative, then diodes 240 and 242 are switched on, (provided that the amplitude of signal 310 is sufficient) and diodes 236 and 238 are switched off. At such a time, the input 214 is disconnected from the balun 210 and the balun is connected to ground.

From the point of view of input port 214, the switching circuit 214 "chops" the IF signal as shown in trace 312. Effectively, a high frequency component due to the switching action has been introduced into the signal at port 214. This high frequency component, shown as trace 314 in FIG. 3, can be extracted from the RF port 218 of "input" port 214 via high pass filter 222. Waveform 314 represents the local oscillator signal 310 modulated by the IF input 300.

The action of the balun 210 is to float the LO signal with respect to ground while ensuring that the remaining parasitic admittances to ground are highly symmetrical. This addresses the problem of poor balance. The connection to earth between diodes 240 and 242 has the effect of connecting the balun 210 to the input port 214 and then to ground for alternate half-cycles of the local oscillator waveform. Although this does not provide a direct connection between the input 214 and ground (for common-mode RF currents which are present at the input in the case of a mixer, or the output in the case of a modulator), it nevertheless allows current to be transferred from the input 214 to ground by idler action. If a relatively low frequency (modulation) signal is presented to port 216, then the action of the switching circuit 212 is to connect this signal to the balun for half-cycles of the local oscillator signal 310. However, the balun is in essence a short circuit to ground at low frequencies so no voltage component can be developed on the balun at this frequency. Instead, low frequency current flows to ground through the balun. For the remaining half-cycles of signal 310, the balun 210 is connected to ground, during which time the inductance of the balun will sustain the flow of this current.

An additional benefit of the extra diodes 240 and 242 (compared with mixer 100) is that the local oscillator load is now symmetrical, consisting of pairs of anti-parallel diodes. This eliminates the need for DC continuity in the balun or any other biasing at the local oscillator input, and eliminates most of the tendency towards second harmonic mixing.

The parasitic impedance to ground of the coaxial line 224 and the dummy line 226 is frequency dependent, becoming low at multiples of half a wavelength, and this could cause sufficient reflection to compromise the switching action of the diodes. In the time domain, the outer conductor 234 of coaxial line 224 and the dummy line 226 can be regarded as short circuited transmission lines having a nominal characteristic impedance determined by their proximity to nearby electrical grounds and, in particular, the ground plane over which the circuit is built. The short circuit will invert and reflect the local oscillator waveform and the reflection will be superimposed on the original waveform after a time delay. At certain frequencies, the relative phases of local oscillator signal and its reflection will be such that destructive interference may occur, thus compromising the switching action of the diodes. Ferrite sleeves could be added to outer conductor 234 and the dummy line 226 but this will impede the flow of modulation current, where the modulation current has a bandwidth of several MHz. Furthermore, ferrite sleeves could introduce low, but significant, levels of non-linearity.

As shown in FIG. 2, the reflections may be controlled by adding loss in the form of resistors to ground (for example 232) placed symmetrically on the outer conductor 234 and on the dummy line 226. The resistors may be given a uniform spacing but non-uniform values, being generally high in value at the live end (i.e. at the connection between coaxial line 224 and dummy line 226) and lower in value at the earthed ends. As an example, the resistor values that yield a worst case reflection of −20 dB with equiripple behaviour are shown in the following table for cases of two up to six resistors (R1 being the resistor adjacent the ground end of each portion of the balun).

| R6 | R5 | R4 | R3 | R2 | R1 | (Earth) | Fractional Bandwidth |
|---|---|---|---|---|---|---|---|
|  |  |  |  | 2.46 | .82 | 0 | 2.55 |
|  |  |  | 3.8 | 2.0 | .84 | 0 | 4.05 |
|  |  | 4.7 | 3.2 | 1.72 | 0.9 | 0 | 5.75 |
|  | 5.6 | 4.7 | 2.8 | 1.7 | 1.0 | 0 | 7.30 |
| 6.2 | 6.2 | 4.0 | 2.64 | 1.7 | 1.1 | 0 | 8.80 |

Figure 4:
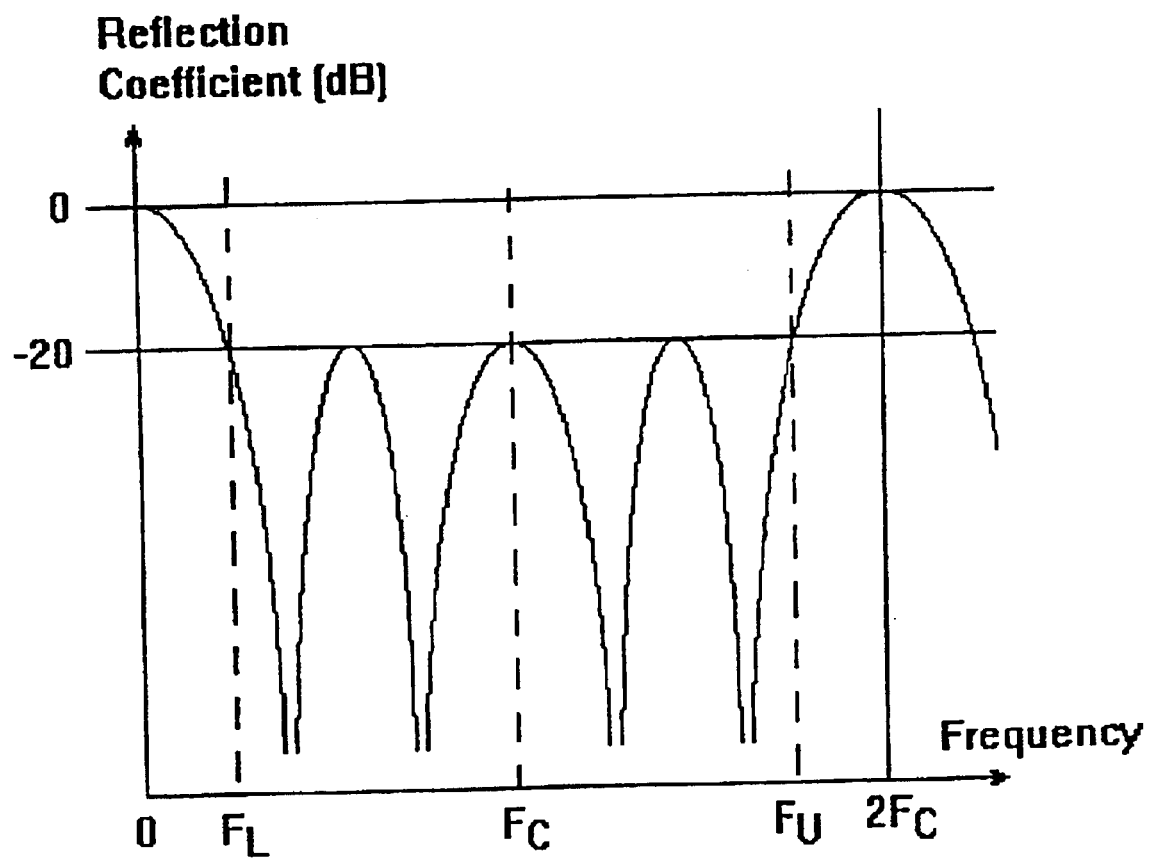
FIG. 4 illustrates a reflection coefficient of the balun of FIG. 2.

The resistor values shown are normalised to the transmission line impedance formed by the outer conductor 234 of the coaxial line 224 to ground. The table shows the fractional bandwidth obtained, centred on a frequency $F_C$, at which the resistor spacing is a quarter of the local oscillator signal wavelength. In FIG. 4, the fractional bandwidth is the value of $F_U/F_L$ centred about $F_C$. N resistors per portion of the balun produces N nulls in the reflection coefficient. It should be noted that adding more resistors increases the bandwidth over which the reflection is controlled, but the reflection always rises to 0 dB at $2F_C$. $F_L$ and $F_U$ are the points at which the reflection coefficient rises above −20 dB.

In theory, the number of resistors per portion of the balun could be increased ad infinitum to extend the bandwidth indefinitely. The discrete resistors could then be implemented as a continuous resistive film on the outer conductor 234 to ground and in a similar manner on the dummy line 226. In another variant, again using discrete resistors, the resistors could be arranged with an unequal or irrational spacing. This would avoid there being a frequency ($2F_C$ in FIG. 4) at which all the resistors fall on voltage nodes (equivalent to half a wavelength between resistors). The resultant control of the reflection coefficient is poorer and not of equiripple nature, but it does extend over a much wider frequency range for a given number of resistors.

Figures 5A, 5B:
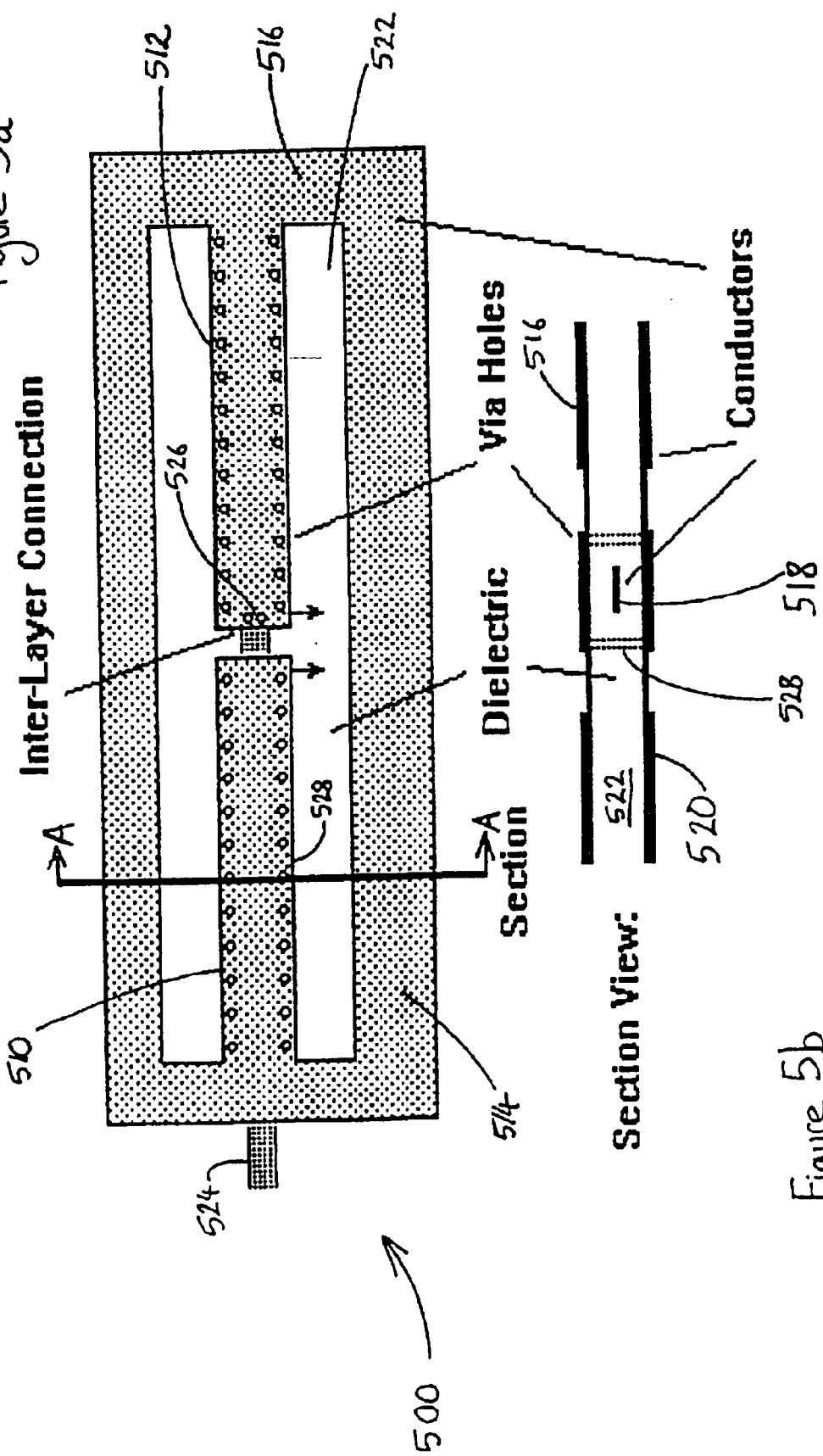
FIG. 5 illustrates an alternative balun which can be used in the modulator of FIG. 2.

FIG. 5 illustrates an alternative strip-line balun 500 which can be used in the modulator of FIG. 2. Balun 500 comprises a transmission line portion 510 and a dummy portion 512 both surrounded by, and connected at their outer ends to, a ground-plane 514. The balun 500 comprises a laminate of three conductors 516, 518 and 520. The intermediate conductor 518 is mounted in a dielectric layer 522 which spaces it from the outer conductors 516, 520. FIG. 5b is a cross-section on line A—A in FIG. 5A. It illustrates the laminar structure of the balun 500.

The intermediate conductor 518 extends substantially through only transmission line portion 510. The local oscillator signal is supplied to the free end 524 of the intermediate conductor and the other end is connected to the two outer conductors 516 and 520 at the free end of the dummy portion 512 by means of metal plated through-holes 526. As is apparent from FIG. 5b, the outer conductors 516 and 520 are interconnected by "vias" (for example, 528 in FIG. 5b—they are metal plated holes) provided along both transverse edges of both the transmission line portion 510 and the dummy portion 512.

The balun 500 operates in a manner analogous to balun 210 and can similarly be provided with distributed loss to ground over the transmission line portion 510 and the dummy portion 512. The strip-line balun 500 is particularly suited to high frequency applications.

It will be apparent that various constructions and implementations of the balun can be employed, as the skilled person sees fit under the circumstances.

It will also be apparent that the embodiment may also be used for frequency down conversion, or demodulation. In such an application, a relatively high frequency signal is applied to port 218 of the input 214 and a relatively lower frequency signal is extracted at port 216.

What is claimed is:

1. Signal combining apparatus comprising a terminal, a switch, and a balun, wherein the balun is connected via the switch to the terminal and ground, and consists of a portion of transmission line connected to a portion of dummy line, the switch being such that when a control signal is supplied to the balun, the switch alternately connects the balun to the terminal and to ground to generate in the terminal an output signal related to an input signal in the terminal.

2. Apparatus according to claim 1, wherein the balun is a Pausey Stub balun.

3. Apparatus according to claim 1, wherein the balun is a stripline device.

4. Apparatus according to claim 1, wherein the outer surface of the transmission line and dummy portions of the balun have a distributed resistance to ground thereon.

5. Apparatus according to claim 4, wherein the distributed resistance may decrease along either portion in the direction away from the connection between the portions.

6. Apparatus according to claim 5, wherein the distributed resistance is provided by a resistive film of varying resistance.

7. Apparatus according to claim 4, wherein the distributed resistance is provided by discrete resistors spaced along the outside of the portions.

8. A method of combining signals using apparatus comprising a balun connected via a switch to a terminal and ground and consisting of a portion of transmission line connected to a portion of dummy line, the method comprising supplying an input signal to the terminal, and supplying a control signal to the balun to alternately connect the balun via the switch to the terminal and ground so that an output signal is generated in the terminal.

* * * * *